United States Patent [19]

Wang

[11] Patent Number: 5,095,239
[45] Date of Patent: * Mar. 10, 1992

[54] VARISTOR IN AN ELECTRIC MOTOR

[75] Inventor: Patrick S. Wang, Repulse Bay, Hong Kong

[73] Assignee: Johnson Electric S.A., La Chaux de Fonds, Switzerland

[*] Notice: The portion of the term of this patent subsequent to Aug. 22, 2006 has been disclaimed.

[21] Appl. No.: 436,198

[22] Filed: Nov. 14, 1989

[30] Foreign Application Priority Data

Nov. 14, 1989 [GB] United Kingdom ............... 8826611

[51] Int. Cl.$^5$ ..................... H02K 11/00; H02K 9/28; H01R 39/46
[52] U.S. Cl. ................................. 310/221; 310/220; 310/64; 310/51
[58] Field of Search ............... 310/64, 68 R, 51, 72, 310/220, 221, 222

[56] References Cited

U.S. PATENT DOCUMENTS

| | | | |
|---|---|---|---|
| 2,470,096 | 5/1949 | Eck ..................... | 310/220 |
| 3,487,248 | 12/1969 | Kaneko et al. .......... | 310/51 |
| 3,488,538 | 1/1970 | Hayashi ................ | 310/220 |
| 3,745,505 | 7/1973 | Turnbull et al. ....... | 338/20 |
| 4,734,607 | 3/1988 | Ikawa et al. .......... | 310/72 |
| 4,833,357 | 5/1989 | Tamura et al. ......... | 310/221 |
| 4,859,893 | 8/1989 | Wang .................. | 310/220 |

FOREIGN PATENT DOCUMENTS

| | | | |
|---|---|---|---|
| 0206980 | 12/1986 | European Pat. Off. . | |
| 0036613 | 4/1978 | Japan ................. | 310/51 |
| 0147904 | 12/1978 | Japan ................. | 310/221 |
| 0106069 | 8/1980 | Japan ................. | 310/51 |
| 629941 | 9/1949 | United Kingdom . | |
| 1547093 | 6/1979 | United Kingdom ....... | 310/221 |

*Primary Examiner*—Steven L. Stephan
*Assistant Examiner*—C. LaBalle
*Attorney, Agent, or Firm*—Fleit, Jacobson, Cohn, Price, Holman & Stern

[57] ABSTRACT

In a fractional horsepower PMDC motor a varistor comprises an annular ring of varistor material having a heat sink bonded to one face. The heat sink includes a plurality of fan blades and is attached to a commutator of the motor. The heat sink increases the thermal capacity of the varistor to resist overheating under stall conditions and improves heat dissipation when the motor is running.

5 Claims, 1 Drawing Sheet

VARISTOR IN AN ELECTRIC MOTOR

INTRODUCTION

The present invention relates to a varistor in an electric motor, particularly a fractional horsepower permanent magnet direct current (PMDC) motor.

BACKGROUND

To suppress noise in small electric motors, particularly fractional horsepower permanent magnet direct current motors, a varistor may be electrically connected across the commutator segments of the motor.

The properties of a varistor may be described by its E1 and E10 levels. The E1 level is the voltage at which 1 milliamp is conducted and the E10 that at which 10 milliamps are conducted. The E1 and E10 levels are temperature dependent and will drop as the varistor temperature rises. For efficient operation of the motor it is necessary to have stable E1 and E10 levels, and in particular to keep the E10 level above the normal operating voltage of the motor otherwise too much current will be shunted through the varistor. Many small PMDC motors are used in high temperature environments, typically 80 degrees centigrade, and so the temperature stability of the varistor becomes particularly important. Also, under stall conditions a high current passes through the motor and localised heating at the commutator will heat up the varistor. If the varistor is not able to dissipate heat fast enough it may overheat and eventually crack or explode.

SUMMARY OF THE INVENTION

The present invention provides a varistor in a permanent magnet direct current electric motor, wherein the varistor has a heat sink attached thereto.

Preferably the varistor is annular and the heat sink is attached to an end face of the varistor. Preferably the heat sink carries a fan blade.

Other preferred features and advantages of the invention will be apparent from the following description and the accompanying claims.

BRIEF DESCRIPTION OF THE DRAWINGS

Referring to the drawings, FIG. 1 shows a fractional horsepower PMDC motor of the type comprising a deep drawn can-like steel casing 20 having a plastics end cap 22 which carries motor brushgear (not shown) for delivering current to a commutator 24 from power input terminals 26. A motor shaft 28 runs in bearings (not shown) in the nd cap 22 and a closed end of the casing 20. Shaft 28 carries the commutator 24 and an armature (not shown). Permanent magnets (not shown) are carried by the casing 20 and form the motor stator.

Figure 1:
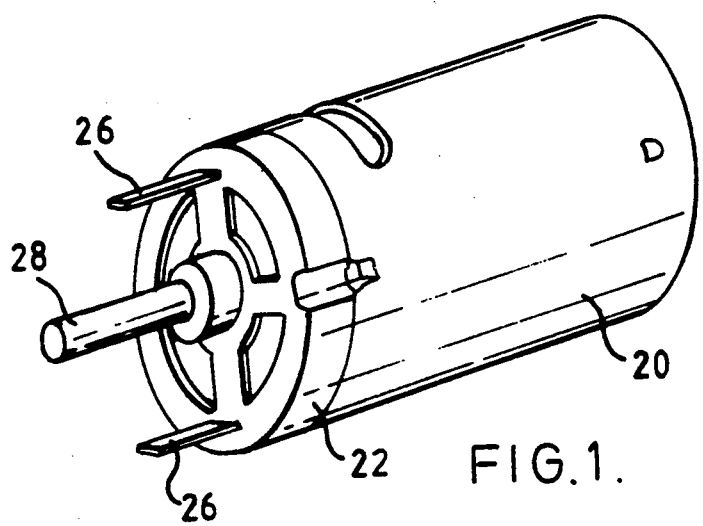
FIG. 1 is a perspective view of a fractional horsepower PMDC motor embodying the invention.

A varistor 30 in accordance with the invention comprises an annular ring 32 of varistor material, that is material whose resistance varies with voltage, which ring has an annular heat sink 34 mounted on a rear face 36. The heat sink 34 extends beyond the outer periphery of the annular ring 32 and has a plurality of fan blades 38 on its surface 40, which abuts the ring 32, radially outwardly of the ring 32.

The heat sink 34 is bonded to the ring 32 by adhesive and is formed of a material having a high thermal capacity and good heat conductance properties, typically it will be of metal.

Figure 2:
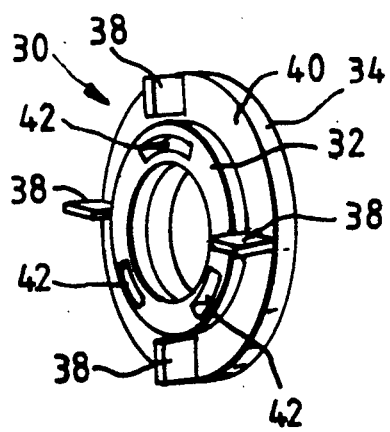
FIG. 2 is a perspective view on an enlarged scale of a varistor in accordance with the invention.

The ring 32 carries a plurality of silver pads 42 on its front face 44 for connection to tangs 46 of the commutator 24 (FIG. 2).

The rear face 36 may be coated with silver or other conductive material to provide a capacitance between the tangs 46. In this case the heat sink 34 may be of electrically conductive material which is bonded direct to the silvered face 36. Where the face is not silvered, the heat sink 34 is preferably insulated from the varistor ring 2 and may be, for example, of anodised aluminium.

The heat sink 34 increases the thermal capacity of the varistor and so slows down the temperature rise of the varistor under stall conditions as well as providing a greater area for heat dissipation. Under running conditions the heat sink 34 and particularly the fan blades 38 enhance the heat dissipation from the varistor ring.

Figure 3:
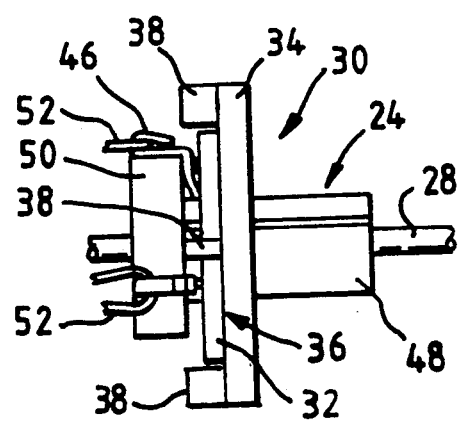
FIG. 3 is a side view of the varistor of FIG. 2 mounted on a commutator of the fractional horsepower PMDC motor of FIG. 1.

As seen in FIG. 3, the ring 32 is attached to tangs 46 of the segments 48 of commutator 24 in the usual way by soldering. The tangs 46 are supported on a collar 50 of a base of the commutator 24. The tangs 46 are forged to armature wire 52 of the motor armature (not shown) which is mounted on the shaft 28 adjacent the commutator 24.

Various modifications may be made to the described embodiment and it is desired to include all such modifications and functional equivalents as fall within the scope of the accompanying claims.

What is claimed is:

1. A fractional horsepower permanent magnet direct current motor having a varistor electrically connected across segments of a commutator of the motor, and a heat sink mounted on the varistor, wherein the varistor is annular and directly mounted on the commutator, each segment of the commutator being electrically connected to the varistor.

2. A motor as claimed in claim 1, wherein the heat sink is annular.

3. A varistor as claimed in claim 1, wherein the heat sink extends beyond the outer periphery of the varistor.

4. A varistor as claimed in claim 3, wherein at least one fan blade is provided on the heat sink.

5. A fractional horsepower permanent magnet direct current motor comprising a commutator mounted on a shaft of the motor for rotation therewith, the commutator comprising a plurality of commutator segments mounted on a base, an annular shaped varistor mounted on the commutator and electrically connected to each commutator segment, a heat sink mounted on the varistor to conduct heat therefrom, the heat sink extending beyond the outer periphery of the varistor and including a plurality of fan blades arranged to enhance cooling of the varistor during rotation of the motor shaft.

* * * * *

UNITED STATES PATENT AND TRADEMARK OFFICE
CERTIFICATE OF CORRECTION

PATENT NO. : 5,095,239

DATED : March 10, 1992

INVENTOR(S) : Patrick S. WANG

It is certified that error appears in the above-identified patent and that said Letters Patent is hereby corrected as shown below:

On the title page, item [30], the correct date of the British Priority should be -- Nov. 14, 1988 --.

Signed and Sealed this

Second Day of November, 1993

Attest:

BRUCE LEHMAN

*Attesting Officer*  *Commissioner of Patents and Trademarks*